(12) United States Patent
Ikuta

(10) Patent No.: US 7,924,901 B2
(45) Date of Patent: Apr. 12, 2011

(54) SURFACE EMITTING LASER INCLUDING A METAL FILM HAVING A PERIODIC FINE STRUCTURE

(75) Inventor: Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

(21) Appl. No.: 12/023,872

(22) Filed: Jan. 31, 2008

(65) Prior Publication Data

US 2008/0192779 A1    Aug. 14, 2008

(30) Foreign Application Priority Data

Feb. 8, 2007   (JP) ................................ 2007-029657

(51) Int. Cl.
  *H01S 5/20*   (2006.01)
  *H01S 5/026*  (2006.01)
  *H01S 5/183*  (2006.01)
(52) U.S. Cl. .................. 372/87; 372/50.124; 372/50.21; 372/50.23
(58) Field of Classification Search ............. 372/50.124, 372/50.21, 50.23, 87
   See application file for complete search history.

(56) References Cited

U.S. PATENT DOCUMENTS

| | | | | |
|---|---|---|---|---|
| 5,973,316 A * | 10/1999 | Ebbesen et al. | ............... | 250/216 |
| 6,154,480 A | 11/2000 | Magnusson et al. | | |
| 7,483,130 B2 * | 1/2009 | Baumberg et al. | ............ | 356/301 |
| 7,697,586 B2 * | 4/2010 | Ikuta | ........................ | 372/50.124 |
| 2005/0152430 A1 | 7/2005 | Onishi et al. | | |
| 2009/0035884 A1 * | 2/2009 | Ikuta | ................................ | 438/29 |
| 2010/0046570 A1 * | 2/2010 | Ikuta | ........................ | 372/50.124 |

FOREIGN PATENT DOCUMENTS

JP   2003-273453   9/2003

OTHER PUBLICATIONS

Jing Feng et al., "Highly Directional Emission Via Coupled Surface-Plasmon Tunneling From Electroluminescence in Organic Light-Emitting Devices", Applied Physics Letters, 2005, vol. 87, 241109, pp. 1 to 3.

Dawn K. Gifford et al., "Emission Through One of Two Metal Electrodes of an Organic Light-Emitting Diode Via Surface-Plasmon Cross Coupling", Applied Physics Letters, 2005, vol. 81, No. 23, pp. 4315-4317.

* cited by examiner

*Primary Examiner* — Minsun Harvey
*Assistant Examiner* — Marcia A. Golub-Miller
(74) *Attorney, Agent, or Firm* — Fitzpatrick, Cella, Harper & Scinto

(57)  ABSTRACT

A surface emitting laser comprises an underlayer, an active layer formed on the underlayer, a slab layer formed on the active layer and having a photonic crystal structure optically combined with the active layer, and a metal thin film formed on the slab layer and having a periodic fine structure; and enabling taking-out of the light beam propagating in a layer-plane direction in the slab layer through the metal thin film.

8 Claims, 9 Drawing Sheets

SURFACE EMITTING LASER INCLUDING A METAL FILM HAVING A PERIODIC FINE STRUCTURE

BACKGROUND OF THE INVENTION

1. Field of the Invention

The present invention relates to a construction, a surface emitting laser, and a light-emitting device having the surface emitting laser.

2. Description of the Related Art

Surface emitting lasers which emit a laser beam in a direction perpendicular to the semiconductor substrate surface are being studied and developed actively. The surface emitting laser gives a stable single vertical mode and facilitates two-dimensional arraying. Therefore, the surface emitting laser is promising as a light source for optical communication and optical transmission, and a light source for electrophotography.

A surface emitting laser employing a two-dimensional photonic crystal is disclosed in Japanese Patent Application Laid-Open No. 2003-273453. The photonic crystal is a structure which has the refractive index changing periodically in a repeating distance nearly equal to or shorter than the light wavelength. The two-dimensional photonic crystal surface emitting laser disclosed in Japanese Patent Application Laid-Open No. 2003-273453 comprises an active layer which emits light on injection of a carrier, and a photonic crystal periodic structure which has a two-dimensional refractive index cycle, adjacently to the active layer. The photonic crystal is formed by inscription in a slab-shaped waveguide having a higher refractive index placed horizontally on a substrate, and emits light in the direction perpendicular to the substrate by resonance of the light enclosed in the slab-shaped waveguide.

U.S. Pat. No. 6,154,480 discloses a surface emitting laser which employs a slab containing a photonic crystal as a resonator mirror by utilizing guided mode resonance (hereinafter referred to as "GMR"). In this surface emitting laser, the waveguide mode in the slab waveguide resonates with the radiation mode for emitting the light from the slab by the photonic crystal formed in the slab waveguide. Thereby, the photonic crystal-containing slab is capable of decreasing the transmittance or increasing the reflectivity remarkably of the incident light in a direction perpendicular to the face of the slab wave guide at the GMR resonance wavelength. That is, the photonic crystal-containing slab serves as a mirror.

However, the above-mentioned two-dimensional photonic crystal surface emitting laser has disadvantages below.

The technique disclosed in Japanese Patent Application Laid-Open No. 2003-273453 causes loss of light by leakage through the non-photonic region of the slab not containing the photonic crystal structure (hereinafter referred to as a "non-photonic structure region") to lower the light utilization efficiency. In a practical device, since the size of region containing the photonic crystal structure (hereinafter referred to as a "photonic structure region") is limited, a part of the light resonating in the photonic structure region propagates in the waveguide and leaks out of the photonic structure region. The light leaking to the non-photonic structure region does not contribute the laser oscillation, and cannot be utilized as the surface emission output to cause a loss of light and to lower the light utilization efficiency.

In the laser described in U.S. Pat. No. 6,154,480 also, since the size of the photonic structure region is limited, a part of the light resonating by GMR in the photonic crystal slab leaks out in the direction of plane of slab waveguide. As the result, the reflectivity of the mirror utilizing the GMR is decreased correspondingly to the leakage to decrease the output of the surface emitting laser employing the above mirror.

Incidentally, the laser described in Japanese Patent Application Laid-Open No. 2003-273453 is classified as a distributed feed back laser type (DFB type), and the laser described in U.S. Pat. No. 6,154,480 is classified as a vertical cavity surface emitting laser type (VCSEL type).

The present invention intends to provide a construction, a surface emitting laser which enables effective utilization of the leaking light guided in the horizontal direction of the slab containing the photonic crystal, and to provide a light emitting device having the surface emitting laser.

SUMMARY OF THE INVENTION

The present invention is directed to a surface emitting laser, comprising an underlayer, an active layer formed on the underlayer, a slab layer formed on the active layer and having a photonic crystal structure optically combined with the active layer, and a metal thin film formed on the slab layer and having a periodic fine structure; and enabling taking-out of the light beam propagating in a layer-plane direction in the slab layer through the metal thin film.

The underlayer can be a lower cladding layer and the slab layer can be an upper cladding layer.

The underlayer can be a lower mirror layer and the slab layer can be an upper mirror layer.

In the surface emitting laser, an electrode can be formed on the metal thin film.

The metal thin film can serve also as an electrode for injection of carriers through the metal thin film to the active layer.

The periodical fine structure can be constituted of a metal and fine holes.

The periodic fine structure can be formed from a fine metal structure.

The present invention is directed to a light-emitting device, comprising the surface emitting laser, and a light collecting mechanism for combining a first emitted light beam from a photonic crystal region and a second emitted light from a metal thin film. The light collecting mechanism can be a lens.

The present invention is directed to a light-emitting device comprising the surface emitting laser, an optical sensor for sensing an emitted light beam from a metal thin film, and a controlling means for controlling drive of the surface emitting laser in accordance with information derived from the optical sensor.

The present invention is directed to a construction, comprising a slab layer having a photonic crystal and guiding a light beam in a layer direction, and a metal thin film formed on the slab layer and having a periodic fine structure; and serving to take out the light beam propagating in a in-plane direction in the slab layer through the metal thin film.

The present invention is directed to a construction comprising a waveguide having a photonic structure region having a photonic crystal and a non-photonic structure region, and a member having a plasmonic crystal structure on the non-photonic structure region; and serving for output of the light beam propagating in the wave guide through the member.

The present invention provides a construction and a surface emitting laser which enable effective utilization of the light leaking out of a photonic crystal-containing slab layer (hereinafter simply referred to as a "slab layer"), and a light emitting device having the surface emitting laser.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

In the description and claims in this specification, the wording "B formed on A" signifies not only that B is formed directly on A, but also that B is formed with interposition of a third member on A.

Figure 3:
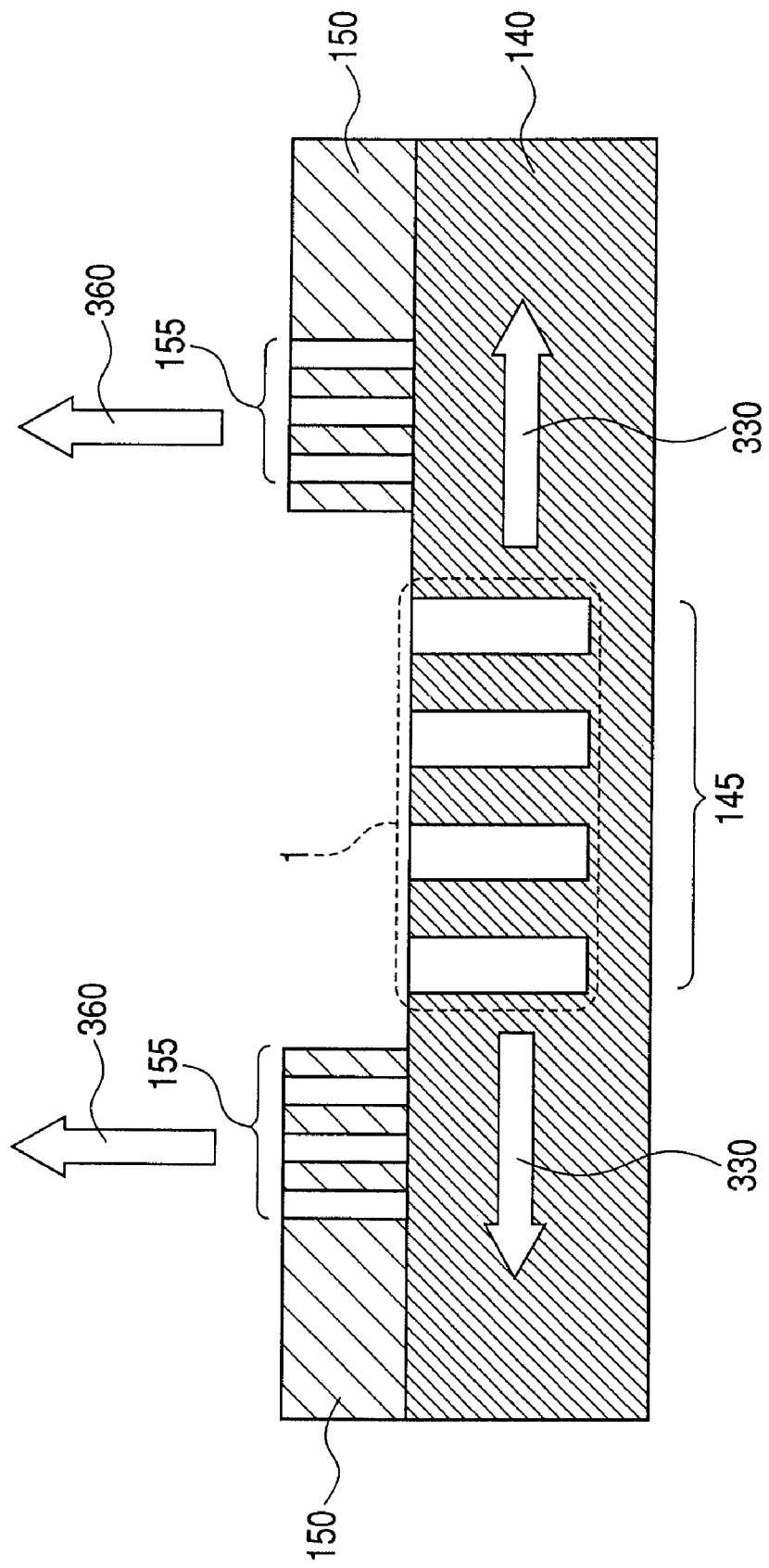
FIG. 3 is a drawing for describing an embodiment of the present invention.

A construction of the present invention is described below with reference to FIG. 3.

Photonic crystal structure 145 containing photonic crystal 1 is formed in slab layer 140 capable of guiding a light beam. The photonic crystal may have a one-dimensional periodic structure or a two dimensional periodic structure. The wavelength of leaking light beam 330 is, for example, 780 nm. The material of slab layer 140 is made of any of the materials capable of transmitting this leaking light beam 330. For example, for the leaking light beam having the wavelength of 680 nm, an example of the material of the slab is $Al_{0.5}Ga_{0.5}As$.

On slab layer 140, metal thin film 150 is formed in a thickness ranging, for example, from 10 nm to 1 μm. This metal thin film 150 has fine structure 155 constituted, for example, of the metal and fine holes and having the shape changing periodically. (Hereinafter this fine structure is referred to as a "periodic fine structure".) This periodic fine structure may be one-dimensional or two-dimensional.

The size of the fine holes in the periodic fine structure 155 ranges, for example, from 10 nm to 10 μm.

Figure 9:
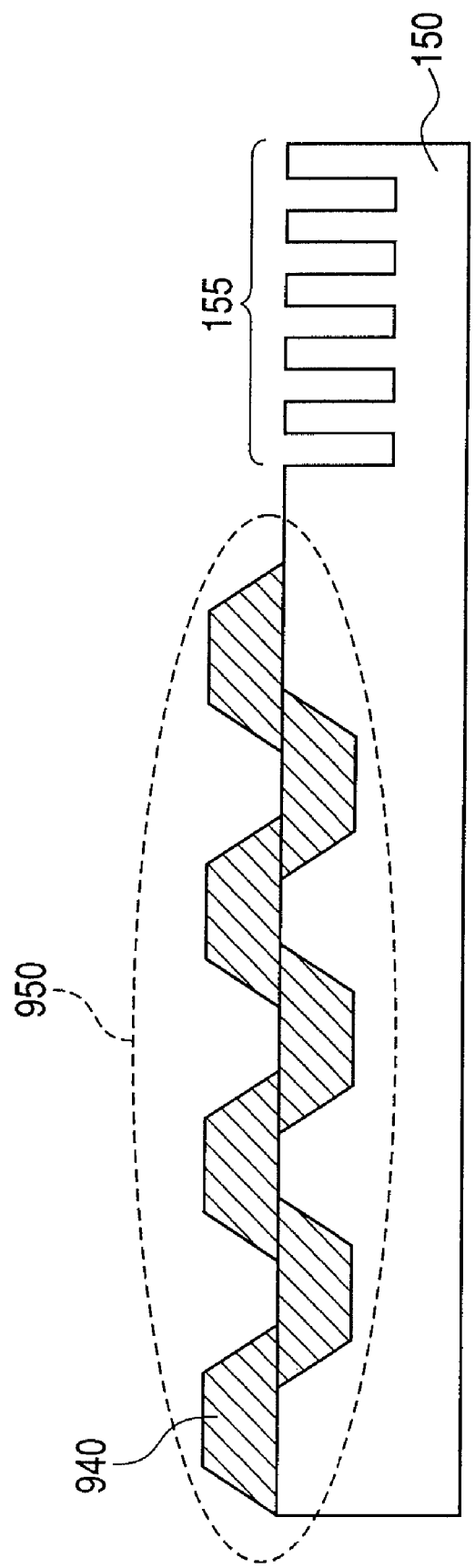
FIG. 9 is a drawing for describing a fine metal structure.

The periodic fine structure is not limited to that constituted of a metal and fine holes (hereinafter referred to as a "hole type"), but may be a structure, as illustrated in FIG. 9, having periodic structure 950 (hereinafter referred to as a "dot type") of fine metal structures 940. The size of fine metal structure 940 ranges, for example, from 10 nm to 10 μm.

Metal fine film 150 contains a so-called plasmonic crystal, having the function as below.

A metal thin film of gold or silver having a thickness of several tens of nanometers can hardly transmit a visible light beam. However, even through the non-light-transmissive metal thin film, the light introduced to the thin metal film can be taken out from the reverse face of the thin film by utilizing surface plasmon-polariton.

At the interface between metal thin film 150 and slab layer 140, the energy is exchanged between the light propagating in the vicinity of metal thin film 150 and the surface plasmon-polariton existing on the surface of metal thin film 150.

Since metal thin film 150 has a fine structure having a suitable periodicity, the surface plasmon-polariton at the interface between slab layer 140 and metal thin film 150 excites the surface plasmon-polariton existing at the interface between metal thin film 150 and the dielectric layer on the reverse side. Thereby the light propagating in slab layer 140 can be taken out through metal thin film 150 out of the constitution. Between metal thin film 150 and slab layer 140, a light-transmissive film may be placed between metal thin film 150 and slave layer 140, insofar as the light can be taken out from the fine structure 155.

As described above, leaking light beam 330 propagating horizontally in the substrate direction is transformed at the interface between slab layer 140 and metal thin film 150 into surface plasmon-polariton, which excites another surface plasmon-polariton on the other interface reverse to the slab layer 140. The latter surface plasmon-polariton is transformed again to light, and is emitted as transformed light 360 from the face of metal thin film 150 reverse to the slab layer.

Thus, in the present invention, a part of the light beam leaking from a photonic crystal can be taken out by utilizing a metal thin film having a periodic fine structure.

In the construction of the present invention, the means of introduction of the light to slab layer 140 is not limited. The light may be introduced by utilizing an active layer formed on the upper side of an underlayer or a lower side of the slab layer as described later in Examples 1 and 2, or may be introduced from outside of the construction.

A carrier may be injected to an active layer through the metal thin film of the present invention. In other words, the light taking-out mechanism with the metal thin film can be constituted not to prevent carrier injection to the active layer.

The light taken out from the metal thin film can also be utilized as a light source for laser output or an output monitor.

EXAMPLES

Figure 1:
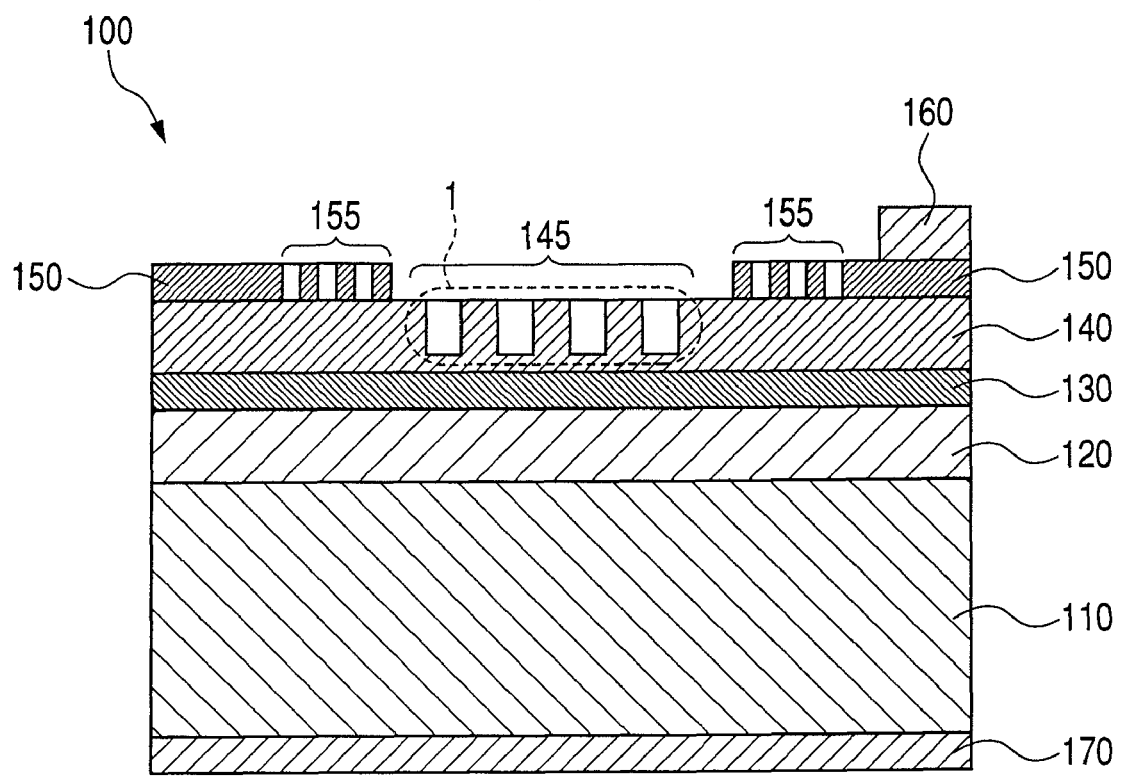
FIG. 1 is a schematic sectional view of the surface emitting laser of Example 1 of the present invention.
Figure 2:
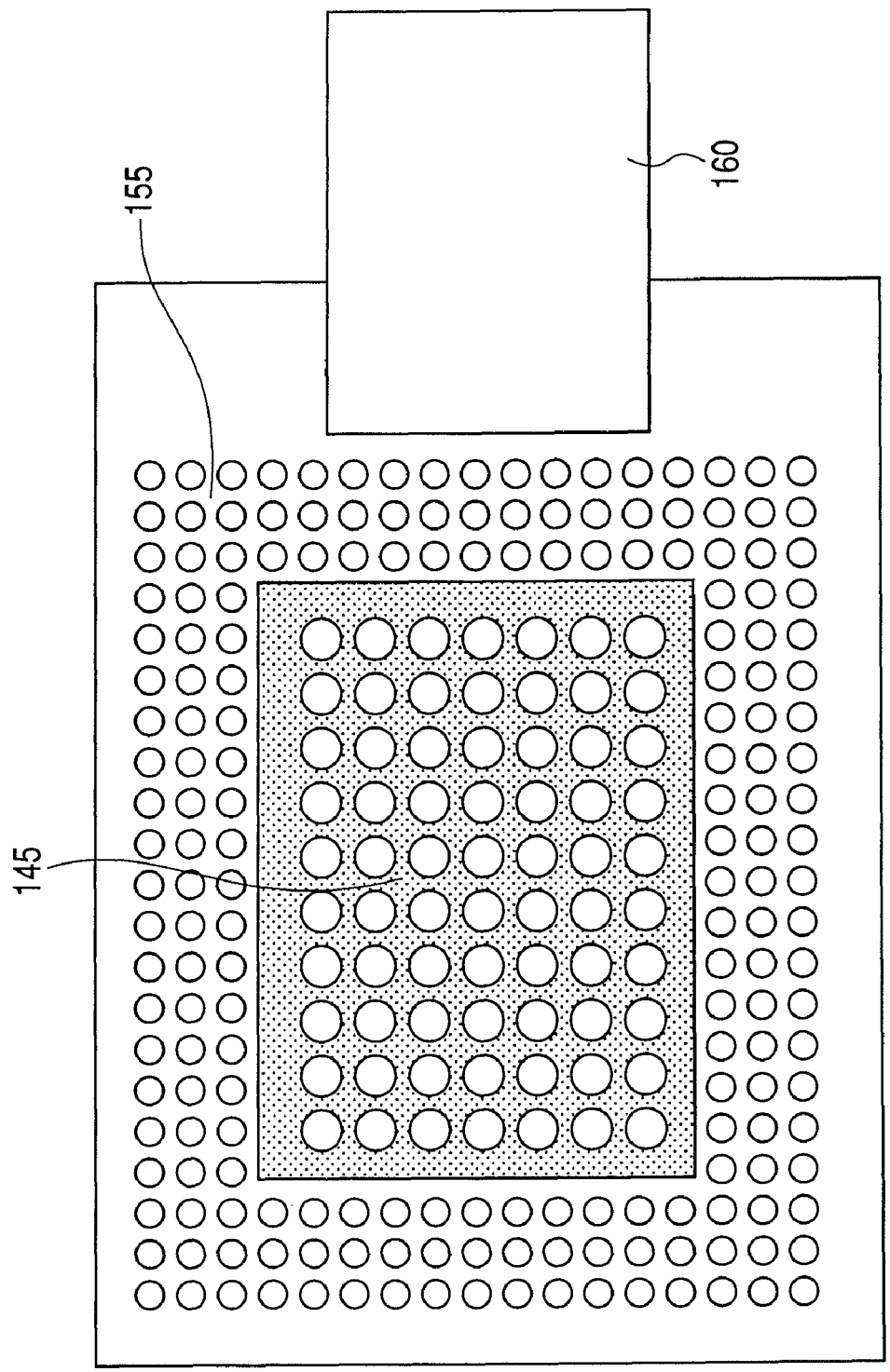
FIG. 2 is a schematic plan view of the surface emitting laser of Example 1 of the present invention.

Examples of a DFB type of surface emitting laser employing the constitution of the present invention are described below with reference to FIGS. 1, 2, and 4.

Example 1

Surface emitting laser 100 is constituted of lower cladding layer 120 as a lower layer, active layer 130, and upper cladding layer 140 as a slab layer, laminated on substrate 110. Upper cladding layer 140 contains two-dimensional photonic structure region 145 containing photonic crystal 1. On upper cladding layer 140, metal thin film 150 is formed. Metal thin film 150 contains periodic fine structure 155. Lower electrode 170 is formed on the lower face of substrate 110. Upper electrode 160 is formed on metal thin film 150. However, the electrodes are not limited thereto: the metal thin film may be designed to serve as the electrode. That is, since the metal is a good conductor of electricity, the thin film of the metal may be used as the upper electrode and the carriers are injected through this metal thin film to the active layer.

A process for production of surface emitting laser 100 is described below.

Firstly, on substrate 110, are laminated lower cladding layer 120, active layer 130, and upper cladding layer 140. Substrate 110 is composed, for example, of an n-type GaAs, a semiconductor material. Lower cladding layer 120 and upper cladding layer 140 are composed of an AlGaAs type semiconductor material. Active layer 130 is of a multiple quantum well structure composed of GaInP/AlGaInP type semiconductor material, and emits light on injection of a carrier. Such a lamination process is conducted by a conventional semiconductor crystal growth technique.

Next, two-dimensional structure region 145 constituted of a two-dimensional photonic crystal is formed on the surface of upper cladding layer 140, for example, by an electron beam lithography technique. The two-dimensional crystal can be prepared on upper cladding layer 140 by forming holes in a two-dimensional periodic pattern of a square or triangular lattice, for example, by a dry etching process. The holes are not limited to be within the upper cladding layer, but may be formed to reach the active layer or the lower cladding layer. The holes may be filled with a substance like a resin having a refractive index different from that of the upper cladding layer 140.

On upper cladding layer 140, metal thin film 150 is formed from a metal like gold by a lift-off method or a like vapor deposition method. The thickness of metal thin film 150 is preferably not more than 1 μm. Therein periodic fine structure 155 is formed by electron beam lithography, etching, preliminary patterning on the upper cladding layer and lift-off, or a like process. The periodic interval and the metal film thickness are adjusted to cause plasmon resonance at the laser wavelength.

Figure 4:
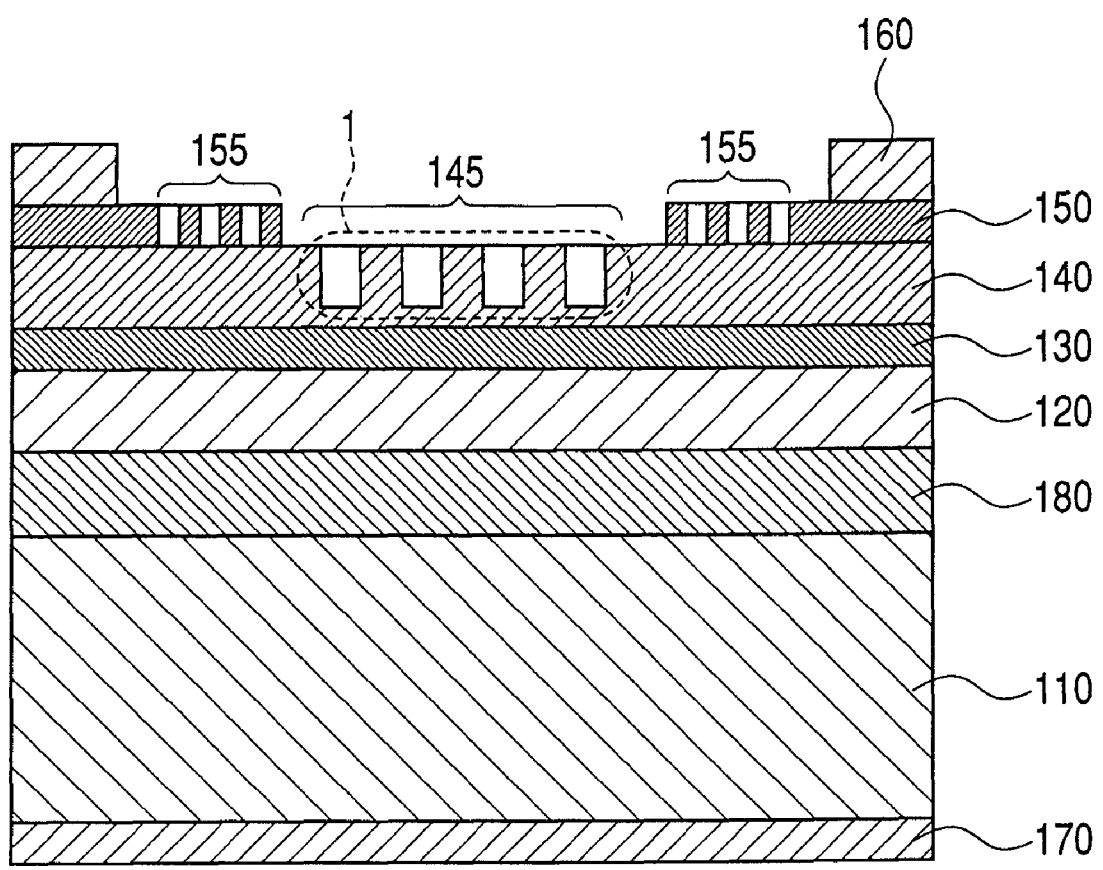
FIG. 4 is a schematic sectional view of a surface emitting laser of another constitution of Example 1 of the present invention in which a multilayered reflection mirror is placed between the lower clad layer and the substrate.

In the surface emitting laser of this Example, multilayered reflecting mirror 180 may be placed between lower cladding layer 120 and substrate 110 as illustrated in FIG. 4. The multilayered reflecting mirror reflects the diffracted light beam from photonic crystal 145 or metal thin film 150 to the substrate to direct the diffracted light to the slab layer to improve the efficiency of taking-out of surface emitting laser beam.

With the above-mentioned structure, the light leaking out of two-dimensional photonic structure region 145 is taken out by periodic fine structure 155 of metal thin film 150, whereby the light generated by surface emitting laser 100 is efficiently utilized.

Example 2

Figure 5:
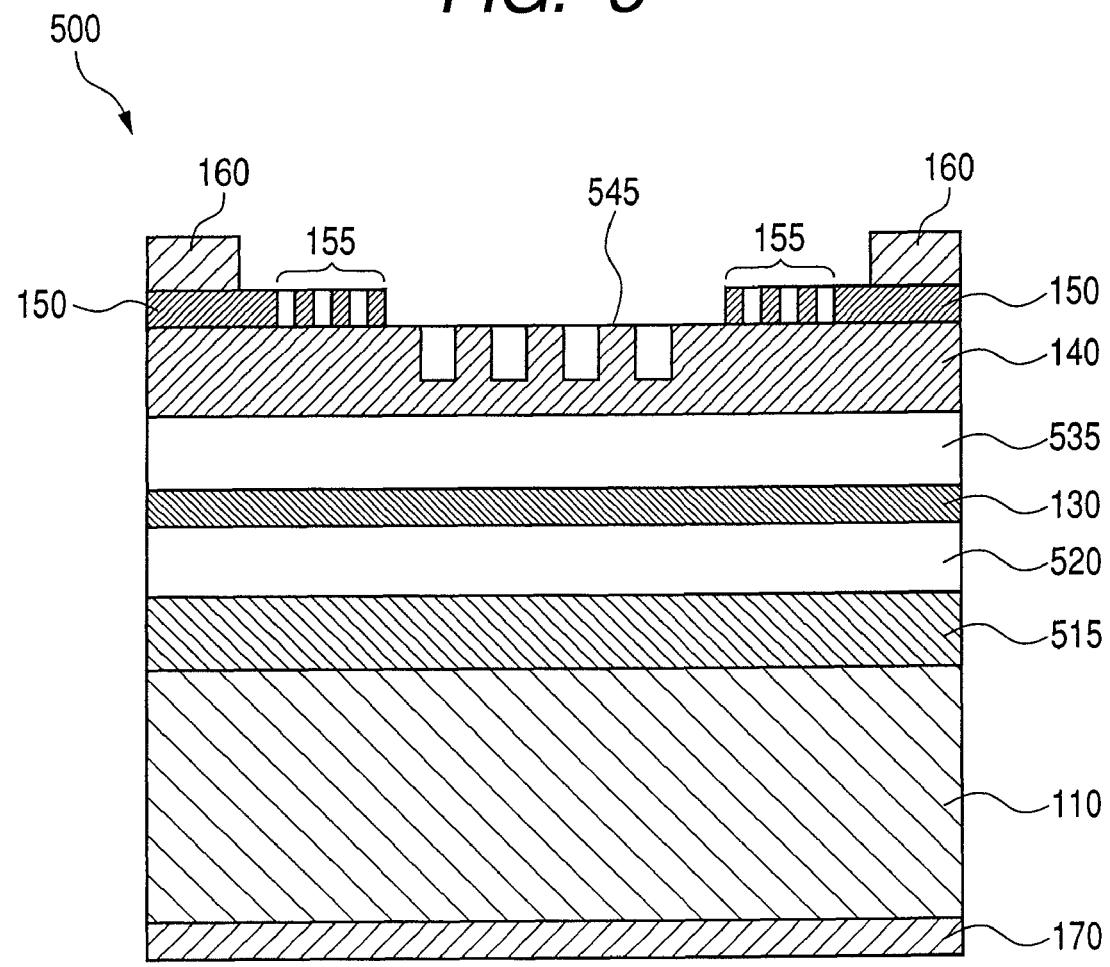
FIG. 5 is a schematic sectional view of the surface emitting laser of Example 2 of the present invention.

A VCSEL type of surface emitting laser employing the constitution of the present invention is described with reference to FIG. 5. The descriptions in Example 1 are applied to the members in this Example similar to those in Example 1.

Surface emitting laser 500 is constituted of lower mirror layer 515 as a lower layer, lower spacer layer 520, active layer 130, upper spacer layer 535, and upper mirror layer 140 as a slab layer, laminated in the named order on substrate 110. Upper mirror layer 140 includes photonic structure region 545 containing photonic crystal 1. On upper mirror layer 140, metal thin film 150 is formed. Periodic fine structure 155 is formed in metal thin film 150.

A process for production of surface emitting laser 100 is described below.

On substrate 110, are laminated multilayered reflecting mirror 515 as a lower mirror layer, lower spacer layer 520, active layer 130, upper spacer layer 535, and upper mirror layer 140. Substrate 110 is composed of a semiconductor material such as n-type GaAs. Multilayered reflecting mirror 515, lower spacer layer 520, upper spacer layer 535, and upper mirror layer 140 are composed respectively of an AlGaAs type semiconductor material.

Multilayered reflecting mirror 515 is constituted of alternate lamination of $Al_{0.9}Ga_{0.1}As$ and $Al_{0.5}Ga_{0.5}As$, each layer having an optical thickness of $\lambda/4$ for the light of a wavelength of 680 nm.

Lower spacer layer 520 and upper spacer layer 535 are composed of $Al_{0.9}Ga_{0.1}As$, and upper mirror layer 140 is composed of $Al_{0.5}Ga_{0.5}As$. The thicknesses of lower spacer layer 520 and upper spacer layer 535 are adjusted to have a resonance wavelength of 680 nm in a vertical resonator of the two mirror of multilayered reflecting mirror 515 and upper mirror layer 140 for placing active layer 130 at the antinode of the field strength of a stationary wave at the resonance wavelength.

Next, on the surface of upper mirror layer 140, there is formed a two-dimensional photonic structure region 545 constituted of two-dimensional photonic crystal, in the same manner as in Example 1. When upper mirror layer 140 is formed in a thickness of 230 nm, the hole having a shape of a cylinder having a depth of 80 nm and a diameter of 40 nm, and the photonic crystal having a lattice constant of 220 nm in the two-dimensional photonic structure region, GMR is caused in upper mirror layer 140 at the wavelength of about 680 nm, giving a high reflectivity.

On upper mirror layer 140, metal thin film 150 is formed from a metal like gold by a lift-off method or a like vapor deposition method. Therein periodic fine structure 155 is formed by electron beam lithography, etching, preliminary patterning on the upper cladding layer and lift-off, or a like process.

Example 3

Figure 6:
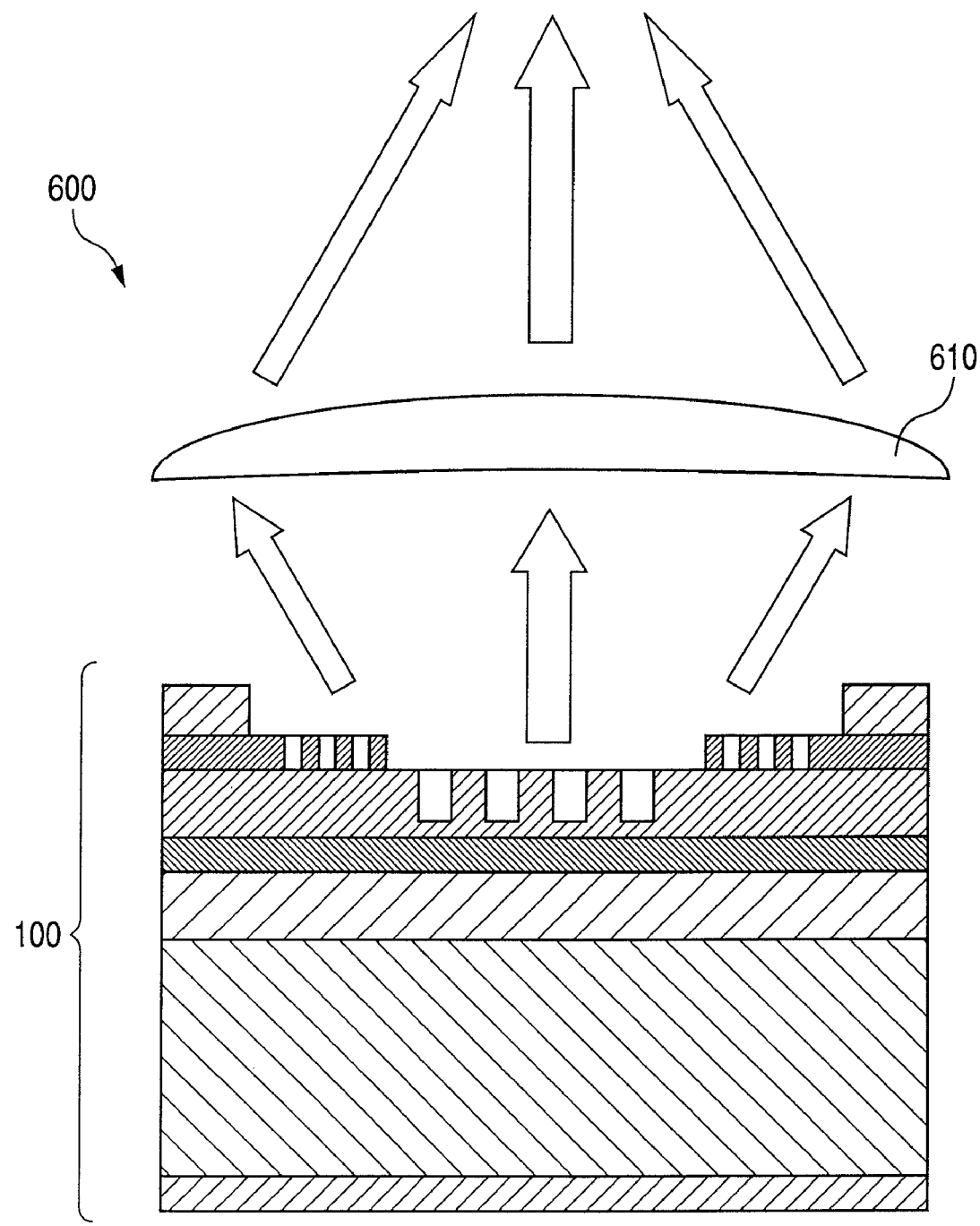
FIG. 6 is a schematic sectional view of the light emitting device of Example 3 of the present invention.

An example of constitution of a light-emitting device is described which is provided with the DFB type of surface emitting laser of Example 1 and a light-collecting mechanism is described with reference to FIG. 6. This device takes out, by the light collecting mechanism, both the light emitted from the photonic crystal of the surface emitting laser and the light emitted from the metal thin film in combination.

Light-emitting device 600 is constituted of surface emitting laser 100 and light-collecting mechanism 610. Light-collecting mechanism 610 is exemplified by a convex lens, and is placed to combine the light emitted from photonic region 145 of surface emitting laser 100 and the light emitted from periodic fine structure 155.

Light-emitting device 600 having such a constitution can give a larger output than that of a surface emitting laser having no periodic fine structure in the metal thin film. The combination of the emitted light from photonic structure region 145 and the light emitted from periodic fine structure 155 is preferably made coherent as a whole.

The VCSEL type surface emitting laser described in Example 2 can be employed in the light emitting device of this Example.

Example 4

Figure 7:
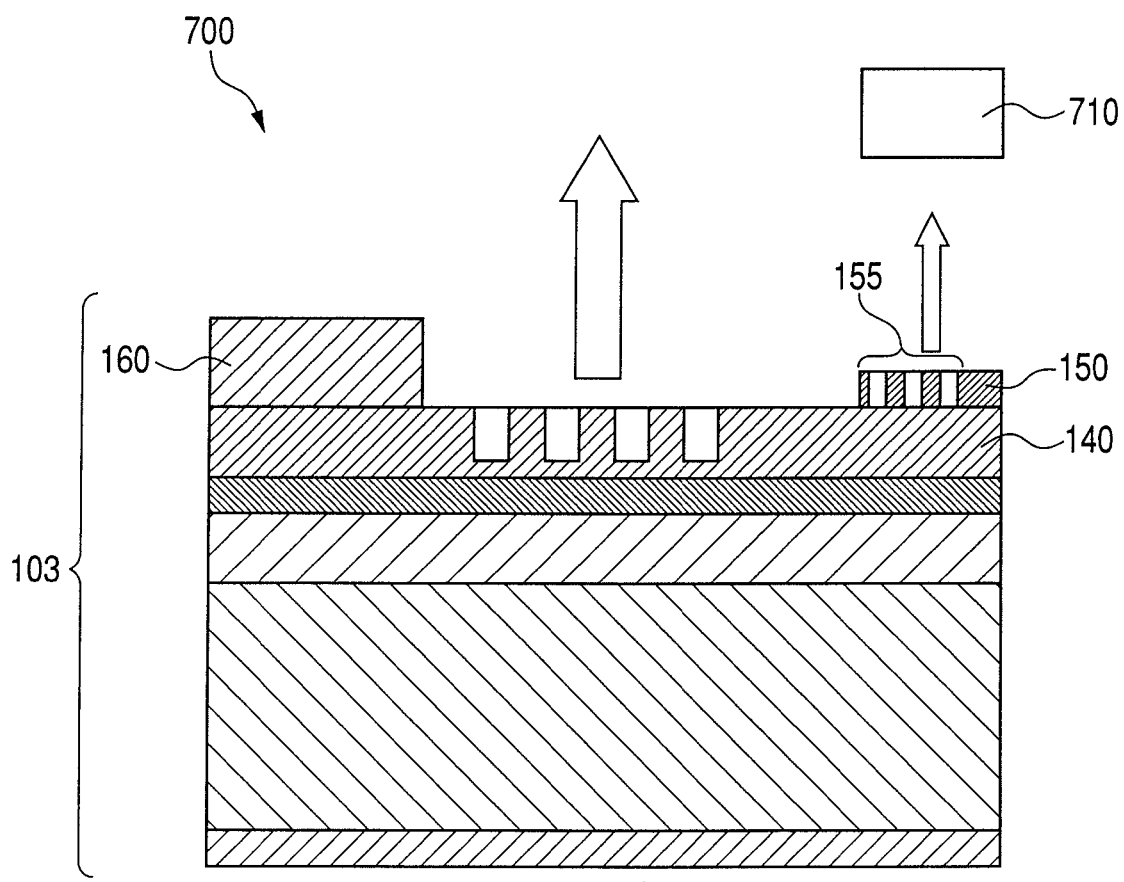
FIG. 7 is a schematic sectional view of the light emitting device of Example 4 of the present invention.
Figure 8:
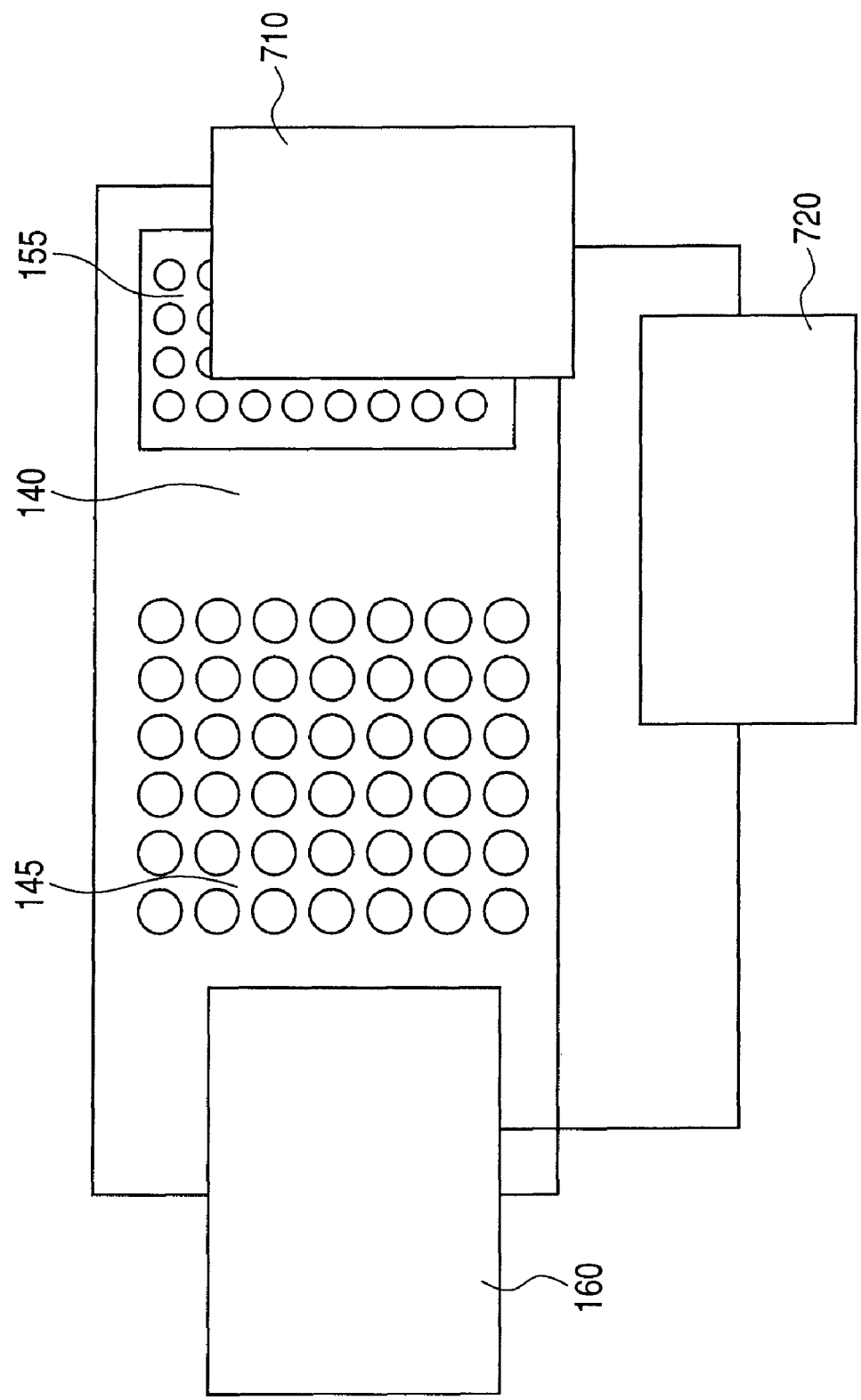
FIG. 8 is a schematic drawing for describing the light emitting device of Example 4 of the present invention.

A constitution of a light-emitting device having a surface emitting laser and an optical sensor is described with reference to FIGS. 7 and 8. In this light-emitting device, the light emitted from a metal thin film is monitored by the optical sensor, and the output of the surface emitting laser is controlled according to the information from the optical sensor.

Light-emitting device 700 is constituted of a surface emitting laser 103 and optical sensor 710. Optical sensor 710 is placed at a position suitable for receiving the light emitted from periodic fine structure 155 of the metal thin film as illustrated in FIGS. 7 and 8. Surface emitting laser 103 is the same as the surface emitting laser 100 of Example 1 except a part of periodic fine structure 155 of the metal thin film. In surface emitting laser 103 of this Example, upper electrode 160 is formed directly on upper cladding layer 140, and periodic fine structure 155 of the metal thin film is placed at another position on the upper cladding layer. In this constitution, periodic fine structure 155 serves to take out the light propagating in upper cladding layer 140, but does not serve as the carrier injection path. Naturally, the periodic fine structure may be placed so as to inject the carriers from the electrode through the metal thin film to the active layer as shown in Examples 1 to 3.

The intensity of the light emitted from periodic fine structure 155 is correlated with the intensity of the light emitted from photonic structure region 145. Therefore, the intensity of the light emitted from photonic structure region 145 can be estimated by monitoring the intensity of light emitted from periodic fine structure 155. Therefore, the intensity of the light emitted from photonic structure region 145 can be stabilized by feedback of this estimation result. In other word, the drive of the surface emitting laser can be controlled by controlling the injection of carries to upper electrode 160 by controlling means 720 in accordance with the information on the output intensity detected by optical sensor 710.

With light-emitting device 700 having such a constitution, the light emission intensity from surface emitting laser 103 can be estimated by utilizing the unavailable light. Therefore, the emitted light from surface emitting laser 103 need not be intercepted or the output need not be lowered for monitoring the output.

The VCSEL type surface emitting laser described in Example 2 can be applied to the light emitting device of this Example.

Examples of the surface emitting laser and light-emitting device employing the surface emitting laser are described above. The present invention is not limited by the above Examples, and can be modified or changed in various manners.

The semiconductor useful for practicing the invention is not limited to those employed in the above Examples in the present invention. For instance, GaAs type materials are used as the material for the surface emitting laser in Example 1, but other materials such as InP type and GaN type can be used suitably.

The process for film formation is not limited to those employed in the above Examples.

The shapes of the one-dimensional or two-dimensional photonic structure region, or of the periodic fine structure of the metal thin film may be modified or changed within the gist of the present invention.

The surface emitting laser and light-emitting device of the present invention can be used for constituting an arrayed laser which is constituted of plural surface emitting laser on a substrate or substrates.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-029657, filed Feb. 8, 2007, which is hereby incorporated by reference herein in its entirety.

What is claimed is:

1. A surface emitting laser, comprising:
   an underlayer;
   an active layer formed on the underlayer, the active layer generating a light beam;
   a slab layer formed on the active layer comprising:
      a photonic crystal region optically combined with the active layer, and
      a region without the photonic crystal; and
   a metal thin film formed on the slab layer and having a periodic fine structure, wherein the periodic fine structure is only formed above the region of the slab layer not containing the photonic crystal, and the metal film is not formed above the photonic crystal region of the slab layer,
   wherein the periodic fine structure is constituted of periodically arranged holes having a diameter in the range from 10 nm to 10 µm, and
   wherein the light beam that is propagating in the in-plane direction in the slab layer exits the layer through the metal thin film.

2. The surface emitting laser according to claim 1, wherein the underlayer is a lower cladding layer and the slab layer is an upper cladding layer.

3. The surface emitting laser according to claim 1, wherein the underlayer is a lower mirror layer and the slab layer is an upper mirror layer.

4. The surface emitting laser according to claim 1, wherein an electrode is formed on the metal thin film.

5. The surface emitting laser according to claim 1, wherein the metal thin film serves also as an electrode for injection of carriers through the metal thin film to the active layer.

6. A light-emitting device, comprising
   a surface emitting laser set forth in claim 1, and
   a light collecting mechanism for combining a first emitted light beam from a photonic crystal region and a second emitted light from a metal thin film.

7. The light-emitting device according to claim 6, wherein the light collecting mechanism is a lens.

8. A light-emitting device comprising the surface emitting laser set forth in claim 1,
   an optical sensor for sensing an emitted light beam from a metal thin film, and
   a controlling means for controlling drive of the surface emitting laser in accordance with information derived from the optical sensor.

* * * * *